United States Patent
Hata et al.

(10) Patent No.: US 11,056,584 B2
(45) Date of Patent: Jul. 6, 2021

(54) SEMICONDUCTOR DEVICE

(71) Applicant: DENSO CORPORATION, Kariya (JP)

(72) Inventors: Kensuke Hata, Kariya (JP); Shinichi Hoshi, Kariya (JP); Hideo Matsuki, Kariya (JP); Youngshin Eum, Kariya (JP); Shigeki Takahashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/693,598

(22) Filed: Nov. 25, 2019

(65) Prior Publication Data
US 2020/0091332 A1    Mar. 19, 2020

Related U.S. Application Data

(63) Continuation of application No. PCT/JP2018/020230, filed on May 25, 2018.

(30) Foreign Application Priority Data

Jun. 26, 2017  (JP) .............................. JP2017-124349

(51) Int. Cl.
*H01L 29/778* (2006.01)
*H01L 29/417* (2006.01)
(Continued)

(52) U.S. Cl.
CPC .... *H01L 29/7787* (2013.01); *H01L 29/41758* (2013.01); *H01L 29/4236* (2013.01); *H01L 29/802* (2013.01)

(58) Field of Classification Search
CPC .......... H01L 29/7787; H01L 29/41758; H01L 29/4236; H01L 29/802; H01L 29/32;
(Continued)

(56) References Cited

U.S. PATENT DOCUMENTS

2006/0022218 A1   2/2006  Masumoto et al.
2012/0175679 A1*  7/2012  Marino ................. H01L 29/407
                                                              257/194
(Continued)

FOREIGN PATENT DOCUMENTS

JP   H08-008441 A      1/1996
JP   2011-249281 A     12/2011
JP   2017-212425 A     11/2017

OTHER PUBLICATIONS

Kawai et al., "GaN Power Device" NEC Electronics Seminar, Nov. 8, 2011 (with Partial English Translation).

*Primary Examiner* — Victor A Mandala
(74) *Attorney, Agent, or Firm* — Posz Law Group, PLC

(57) ABSTRACT

In a semiconductor device having an active region and an inactive region, the active region includes a channel forming layer with a heterojunction structure having first and second semiconductor layers, a gate structure portion having a MOS gate electrode, a source electrode and a drain electrode disposed on the second semiconductor layer with the gate structure portion interposed therebetween, a third semiconductor layer disposed at a position away from the drain electrode between the gate structure portion and the drain electrode and not doped with an impurity, a p-type fourth semiconductor layer disposed on the third semiconductor layer, and a junction gate electrode brought into contact with the fourth semiconductor layer. The junction gate electrode is electrically connected to the source electrode to have a same potential as a potential of the source electrode, and is disposed only in the active region.

5 Claims, 6 Drawing Sheets

(51) Int. Cl.
   *H01L 29/423*   (2006.01)
   *H01L 29/80*   (2006.01)
(58) Field of Classification Search
   CPC ............. H01L 29/4238; H01L 29/0657; H01L 29/1066; H01L 29/0619; H01L 29/2003; H01L 29/7786
   See application file for complete search history.

(56) References Cited

U.S. PATENT DOCUMENTS

| | | | |
|---|---|---|---|
| 2013/0082336 A1 | 4/2013 | Imada | |
| 2014/0151747 A1* | 6/2014 | Jeon | H01L 29/42316 257/194 |
| 2015/0162424 A1* | 6/2015 | Briere | H01L 29/42316 257/194 |
| 2015/0263001 A1* | 9/2015 | Saito | H01L 29/7787 257/296 |
| 2016/0086878 A1* | 3/2016 | Otremba | H01L 29/778 257/139 |
| 2016/0093691 A1 | 3/2016 | Echigoya et al. | |
| 2016/0111497 A1* | 4/2016 | Simin | H01L 29/7786 257/365 |
| 2017/0352753 A1* | 12/2017 | Nagahisa | H01L 29/7786 |
| 2019/0123187 A1* | 4/2019 | Tarumi | H01L 29/7786 |

\* cited by examiner

SEMICONDUCTOR DEVICE

CROSS REFERENCE TO RELATED APPLICATIONS

The present application is a continuation application of International Patent Application No. PCT/JP2018/020230 filed on May 25, 2018, which designated the U.S. and claims the benefit of priority from Japanese Patent Application No. 2017-124349 filed on Jun. 26, 2017. The entire disclosures of all of the above applications are incorporated herein by reference.

TECHNICAL FIELD

The present disclosure relates to a semiconductor device.

BACKGROUND

Conventionally, a semiconductor device that includes a switching device having a four-terminal structure has been proposed. The semiconductor device has an active region forming a channel through which carriers flow and an inactive region surrounding the active region, in which a source electrode, a drain electrode, a first gate electrode, and a second gate electrode are appropriately disposed.

SUMMARY

The present disclosure provides a semiconductor device having an active region and an inactive region. The active region includes a channel forming layer with a heterojunction structure having first and second semiconductor layers, a gate structure portion having a MOS gate electrode, a source electrode and a drain electrode disposed on the second semiconductor layer with the gate structure portion interposed therebetween, a third semiconductor layer disposed at a position away from the drain electrode between the gate structure portion and the drain electrode and not doped with an impurity, a p-type fourth semiconductor layer disposed on the third semiconductor layer, and a junction gate electrode brought into contact with the fourth semiconductor layer. The junction gate electrode is electrically connected to the source electrode to have a same potential as a potential of the source electrode, and is disposed only in the active region.

The semiconductor device may further include a gate pad disposed in the inactive region and connected to the MOS gate electrode through a gate wire, a source pad disposed in the inactive region and connected to the source electrode through a source wire, and a drain pad disposed in the inactive region and connected to the drain electrode through a drain wire.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
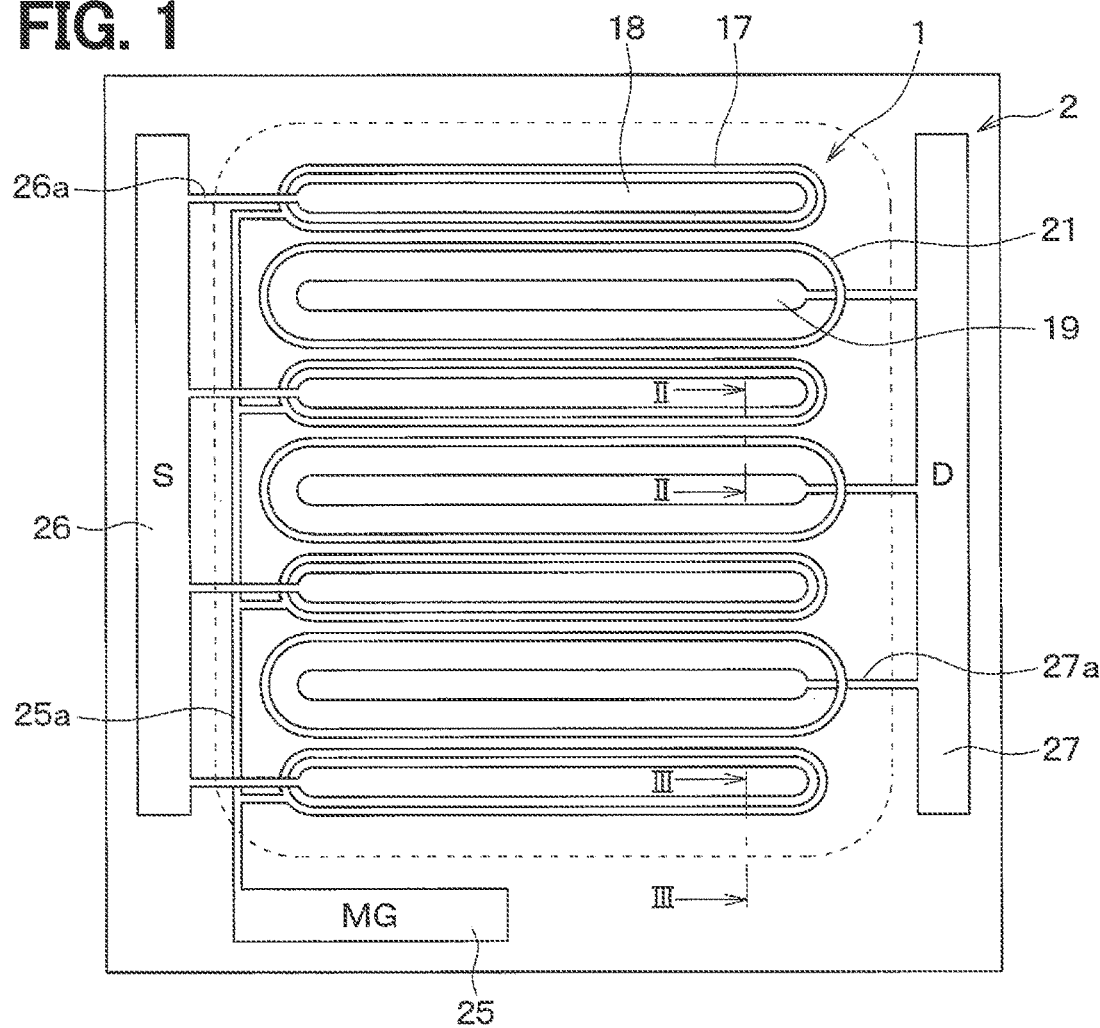
FIG. 1 is a schematic plan view of a semiconductor device according to a first embodiment.

A semiconductor device according to a related art has an active region and an inactive region and includes a switching device having a four-terminal structure. The switching device includes a source electrode and a drain electrode each formed in a comb-tooth shape, and disposed in such a manner the comb teeth of the source electrode and the drain electrode are engaged with each other in the active region. The switching device further includes a first gate electrode and a second gate electrode disposed between the source electrode and the drain electrode. The second gate electrode is drawn from the inside of the active region to the inactive region, and a part of the second gate electrode is disposed between the source electrode and the drain electrode even in the inactive region.

The above-described four-terminal structure may be applied to a switching device having a heterojunction structure. For example, a high electron mobility transistor (HEMT) may have a four-terminal structure.

A HEMT of a four-terminal structure according to a related art has a heterojunction structure formed by stacking an i-GaN layer and an i-AlGaN layer on a substrate made of sapphire or the like. A MOS structure gate electrode (hereinafter referred to as a MOS gate electrode) is formed so as to penetrate the i-AlGaN layer and reach the i-GaN layer, and a source electrode and a drain electrode are formed on the surface of the i-AlGaN layer on both sides of the MOS gate electrode with the MOS gate electrode interposed therebetween. Between the MOS gate electrode and the drain electrode, a stacked layer of a u-GaN layer and a p-GaN layer is formed on a surface of the i-AlGaN layer, and a junction gate electrode (hereinafter referred to as a JG electrode) is formed on a surface of the p-GaN layer.

In the configuration described above, for example, the first gate electrode corresponds to a MOS gate electrode, and the second gate electrode corresponds to a JG electrode. When the JG electrode is formed in the inactive region, the u-GaN layer and the p-GaN layer disposed below the JG electrode are also formed in the inactive region together with the JG electrode.

When the inactive region is formed, for example, by ion implantation to form a defect, carriers (for example, electrons) may be trapped in the defect. In other words, the carriers may be trapped below the JG electrode located in the inactive region. In that case, a threshold voltage of the JG electrode may change, thereby changing the characteristics of the semiconductor device.

According to an aspect of the present disclosure, a semiconductor device has an active region and an inactive region that surrounds the active region, and includes a lateral switching device disposed in the active region. The lateral switching device includes a channel forming layer, a gate structure portion, a source electrode, a drain electrode, a third semiconductor layer, a fourth semiconductor layer, and a junction gate electrode. The channel forming layer is disposed on a substrate, includes a heterojunction structure having a first semiconductor layer made of a first GaN-based semiconductor forming a drift region and a second semiconductor layer made of a second GaN-based semiconductor having a band gap energy higher than a band gap energy of the first GaN-based semiconductor, and has a recessed portion provided in the second semiconductor layer. The gate structure portion includes a gate insulating film disposed in the recessed portion and a MOS gate electrode disposed on the gate insulating film and serving as a gate electrode of a MOS structure. The source electrode and the drain electrode are disposed on the second semiconductor layer in such a manner that the gate structure portion is interposed between the source electrode and the drain electrode. The third semiconductor layer is disposed on the second semiconductor layer at a position away from the drain electrode between the gate structure portion and the drain electrode, and is made of a third GaN-based semiconductor not doped with an impurity. The fourth semiconductor layer is disposed on the third semiconductor layer and is made of a fourth GaN-based semiconductor having a p-type. The junction gate electrode is brought into contact with the fourth semiconductor layer. The junction gate electrode is electrically connected to the source electrode to have a same potential as a potential of the source electrode, and is disposed only in the active region.

According to the above configuration, for example, even if the inactive region is formed by introducing a large number of defects, for example, by ion implantation, the junction gate electrode is not disposed on a region in which the carriers (for example, electrons) are trapped. Accordingly, a threshold of the junction gate electrode can be restricted from varying, and a change in characteristics of the semiconductor device can be restricted.

Embodiments of the present disclosure will be described below with reference to the drawings. In the following embodiments, the same reference numerals are assigned to parts that are the same or equivalent to each other for description.

First Embodiment

Figure 2:
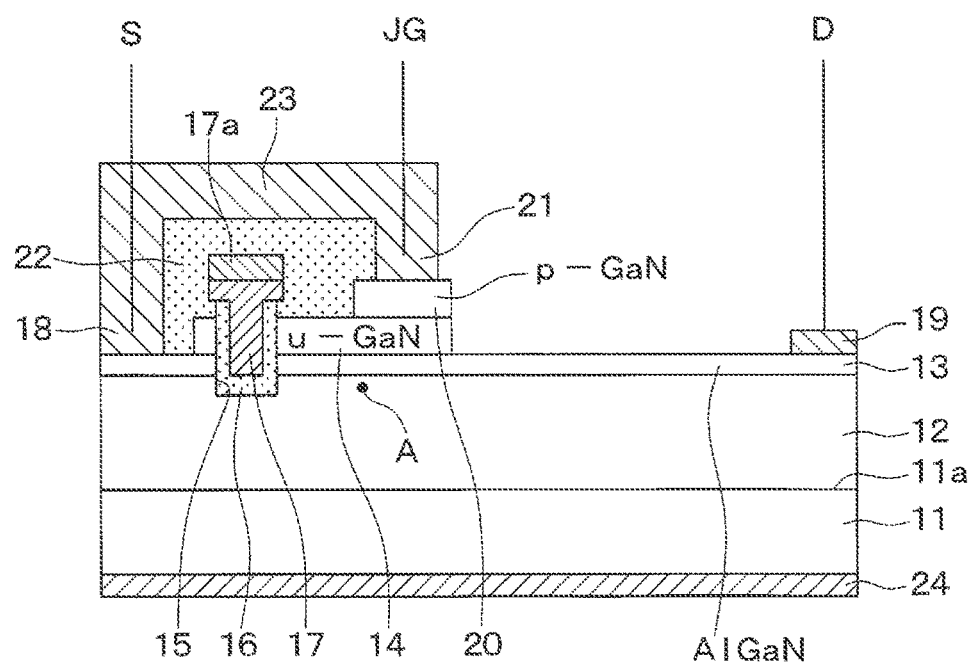
FIG. 2 is a cross-sectional view of the semiconductor device taken along a line II-II in FIG. 1.

A semiconductor device according to a first embodiment will be described with reference to FIGS. 1 to 5. As shown in FIG. 1, a semiconductor device according to the present embodiment has an active region 1 and an inactive region 2 surrounding the active region 1. As shown in FIG. 2, a lateral switching device having a four-terminal structure HEMT is formed in the active region 1. Although not particularly limited, in the present embodiment, the active region 1 has a substantially rectangular shape having a longitudinal direction in a vertical direction of the drawing in FIG. 1.

Figure 3:
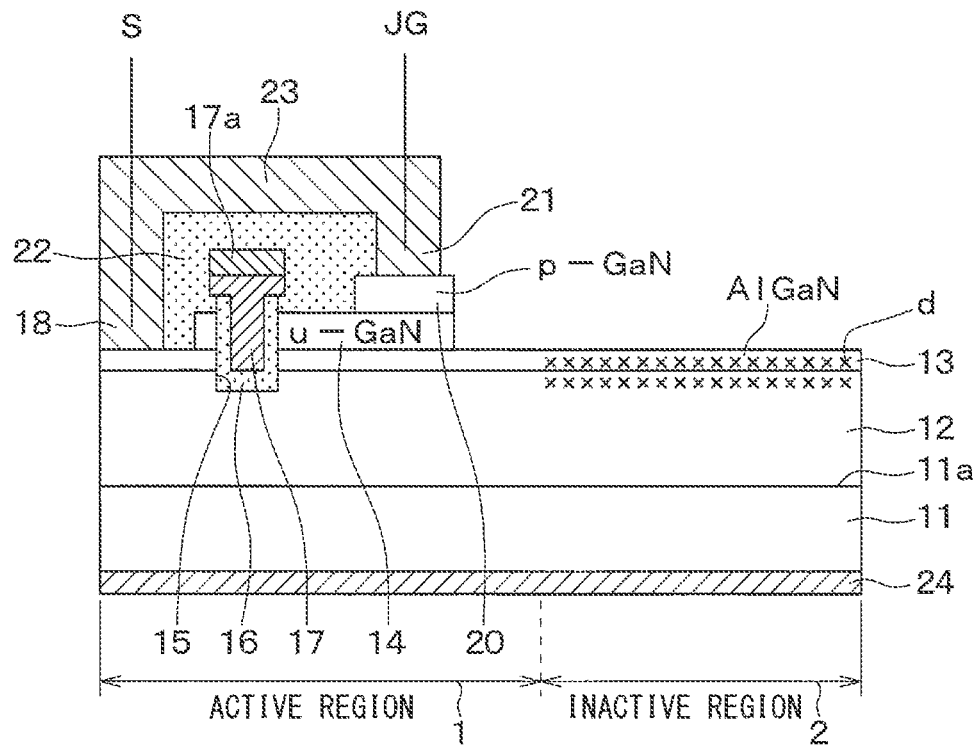
FIG. 3 is a cross-sectional view of the semiconductor device taken along a line III-III in FIG. 1.

Specifically, as shown in FIGS. 2 and 3, the semiconductor device is formed with an undoped GaN (hereinafter referred to as u-GaN) layer 12 formed on one surface 11a of a substrate 11 as a compound semiconductor substrate. An undoped AlGaN (hereinafter referred to as u-AlGaN) layer 13 is formed on a surface of the u-GaN layer 12, and the u-GaN layer 12 and the u-AlGaN layer 13 form a heterojunction structure. In the switching device, the u-GaN layer 12 and the u-AlGaN layer 13 are channel forming layers. Two-dimensional electron gas (2-DEG) carriers are induced toward the u-GaN layer 12 at an AlGaN/GaN interface by a piezoelectric effect and a spontaneous polarization effect, and a carrier induced region forms a channel in which the carriers flow, to thereby operate the switching device.

The substrate 11 is made of a conductive material such as a semiconductor material, for example, Si (111) or SiC. The u-GaN layer 12 may be formed directly on the substrate 11, or may be formed through a buffer layer serving as a base film as required in order to form the u-GaN layer 12 with excellent crystallinity. When the u-GaN layer 12 can be formed on the substrate 11 with excellent crystallinity, the buffer layer may be omitted. The term "crystallinity" as used in the present disclosure means defectives, dislocations, and the like in the u-GaN layers 12, which affect electric and optical characteristics.

The u-GaN layer 12 is a portion configuring an electronic traveling layer which operates as a drift region, and corresponds to a first GaN-based semiconductor layer. The u-GaN layer 12 is made of a GaN-based semiconductor material, and 2-DEG carriers are induced in a surface layer of the u-AlGaN layer 13.

The u-AlGaN layer 13 corresponds to a second GaN-based semiconductor layer, is made of a GaN-based semiconductor material having a band gap energy higher than a band gap energy of the GaN-based semiconductor material configuring the u-GaN layer 12, and forms an electron supply portion.

The u-AlGaN layer 13 is made of $Al_xGa_{1-x}N$ with an Al-mixed crystal ratio of x. The Al-mixed crystal ratio x and the film thickness of the u-AlGaN layer 13 determine a concentration of 2-DEG carriers formed in the vicinity of the surface of the u-GaN layer 12. Therefore, in the present embodiment, the concentration of the 2-DEG carrier is adjusted by adjusting the Al-mixed crystal ratio x and the film thickness of the u-AlGaN layer 13 so that the concentration of the 2-DEG carriers is primarily determined by the Al-mixed crystal ratio, rather than the range in which the concentration of the 2-DEG carriers varies greatly depending on the thickness.

In the present embodiment, the u-GaN layer 12 corresponds to a first semiconductor layer, the u-AlGaN layer 13 corresponds to a second semiconductor layer, and the u-GaN layer 12 and the u-AlGaN layer 13 correspond to a channel forming layer.

In the present embodiment, a large number of defects d are formed in the inactive region 2, for example, by performing ion implantation so as not to induce the 2-DEG carriers. In other words, the inactive region 2 of the present embodiment is configured by forming a larger number of defects d than the number of defects of the active region 1 so as not to induce the 2-DEG carriers. In other words, the inactive region 2 of the present embodiment is an element isolation region.

In the active region 1, a u-GaN layer 14 not doped with an impurity is partially formed on a surface of the u-AlGaN layer 13.

Specifically, the u-AlGaN layer 13 is formed on an entire upper surface of the u-GaN layer 12. The u-GaN layer 14 is formed in the vicinity of the MOS gate electrode 17 (to be described later) of the u-AlGaN layer 13, and extends so as to project toward a drain electrode 19 (to be described later). The u-AlGaN layer 13 and the u-GaN layer 14 are removed in a recessed portion 15. The recessed portion 15 extends in one direction, specifically, a normal direction to a cross section of FIG. 2 as a longitudinal direction. More specifically, the recessed portion 15 is extended along an extension direction of the source electrode 18, which will be described later, when viewed from a normal direction to the one surface 11a of the substrate 11, and the two recessed portions 15 interposing the source electrode 18 therebetween are connected to each other at both ends in the extension direction. In other words, the recessed portion 15 is formed in an annular shape surrounding the source electrode 18, which will be described later, when viewed from the normal direction to the one surface 11a of the substrate 11.

In the recessed portion 15, the MOS gate electrode 17 is buried as a gate structure portion across a gate insulating film 16. Specifically, the gate insulating film 16 having a predetermined film thickness is formed on an inner wall surface of the recessed portion 15, and a MOS gate electrode 17 is further formed on the gate insulating film 16, thereby forming a gate structure portion. Since the gate structure portion including the MOS gate electrode 17 is formed along the recessed portion 15, the gate structure portion is formed so as to surround the source electrode 18, which will be described later, similarly to the recessed portion 15.

The gate insulating film 16 is made of, for example, silicon oxide ($SiO_2$) or alumina ($Al_2O_3$), and the MOS gate electrode 17 is made of a metal such as aluminum and platinum, or Poly-semiconductors doped with an impurity or the like. The gate insulating film 16 and the MOS gate electrode 17 are formed in the recessed portion 15, thereby forming the gate structure portion having a MOS structure. Although the MOS gate electrode 17 may be made entirely of Poly-semiconductors or the like, in the present embodiment, in order to reduce a wiring resistance of the MOS gate electrode 17, a metallic layer 17a is disposed on a surface of the MOS gate electrode 17.

On the other hand, the source electrode 18 and the drain electrode 19 are formed on a surface the u-AlGaN layer 13 on both sides of the gate structure portion with the gate structure portion interposed therebetween. Both the source electrode 18 and the drain electrode 19 are disposed at positions apart from the u-GaN layer 14, and a distance from an end of the u-GaN layer 14 to the drain electrode 19 is set to a predetermined length. The source electrode 18 and the drain electrode 19 are brought in ohmic contact with the u-AlGaN layers 13.

In the present embodiment, the source electrode 18 and the drain electrode 19 extend along one direction in the plane direction of the substrate 11, and more specifically, extend in a direction intersecting with the longitudinal direction of the active region 1. The source electrode 18 and the drain electrode 19 are alternately formed in a direction orthogonal to the extension direction. In FIG. 1, the source electrode 18 and the drain electrode 19 extend in the horizontal direction of the drawing in FIG. 1, and are alternately formed in the vertical direction of the drawing in FIG. 1.

A p-GaN layer 20 of p-type is formed on a surface of a portion of the u-GaN layer 14 between the MOS gate electrode 17 and the drain electrode 19. The p-GaN layer 20 is disposed in such a manner that an end face of the p-GaN layer 20 facing the drain electrode 19 is flush with an end face of the u-GaN layer 14 facing the drain electrode 19, or is positioned closer to the MOS gate electrode 17 than the end face of the u-GaN layer 14 facing the drain electrode 19. In the present embodiment, the u-GaN layer 14 corresponds to a third semiconductor layer made of a third GaN-based semiconductor, and the p-GaN layer 20 corresponds to a fourth semiconductor layer made of a fourth GaN-based semiconductor.

A JG electrode 21 is formed on a surface of the p-GaN layer 20. The JG electrode 21 is connected to the source electrode 18 described above so as to have the same potential as a potential of the source electrode 18.

More specifically, an interlayer insulating film 22 is disposed so as to cover the MOS gate electrode 17, the u-GaN layer 14, and the like, and an electrode layer 23 is formed so as to cover the interlayer insulating film 22. The electrode layer 23 is brought into contact with the u-AlGaN layer 13 through a contact hole provided in the interlayer insulating film 22 and is brought into contact with the p-GaN layer 20. For that reason, the source electrode 18 is configured by a portion of the electrode layer 23 which is brought into contact with the u-AlGaN layer 13, and the JG electrode 21 is configured by a portion of the electrode layer 23 which is brought into contact with the p-GaN layer 20.

In the present embodiment, the source electrode 18 and the JG electrode 21 are formed of the same electrode layer 23 in this manner. For that reason, the wiring resistance and the inductance can be reduced as compared with the case where the source electrode 18 and the JG electrode 21 are connected to each other by a bonding wire or the like.

In FIG. 1, a portion of the electrode layer 23 connecting the source electrode 18 and the JG electrode 21 in FIG. 2 is omitted for facilitation of understanding of the layout of each portion. In other words, in FIG. 1, a portion of the electrode layer 23 located above the MOS gate electrode 17 in FIG. 2 is omitted.

In the present embodiment, the JG electrode 21 is formed in an annular shape surrounding the drain electrode 19 when viewed from the normal direction to the one surface 11a of the substrate 11. In other words, in the present embodiment, the JG electrode 21 is disposed between the source electrode 18 and the drain electrode 19. Although not particularly shown in FIG. 1, the u-GaN layer 14 and the p-GaN layer 20 located below the JG electrode 21 are disposed along the JG electrode 21. In other words, the u-GaN layer 14 and the p-GaN layer 20 are formed so as to surround the drain electrodes 19 when viewed from the normal direction to the one surface 11a of the substrate 11.

As described above, a switching device having four terminals including the MOS gate electrode 17, the source electrode 18, the drain electrode 19, and the JG electrode 21 is formed in the active region 1. On a rear surface of the substrate 11, a rear surface electrode 24 is formed. The rear surface electrode 24 is electrically connected to the source electrode 18 through a wiring pattern (not shown), for example, so that the rear surface electrode 24 has the same potential as the potential of the source electrode 18.

As shown in FIG. 1, a gate pad for the MOS gate electrode 17 (hereinafter referred to a gate pad) 25, a source pad 26, and a drain pad 27 are formed in the inactive region 2.

The MOS gate electrode 17 is connected to the gate pad 25 through a gate wire 25a drawn from the active region 1 to the inactive region 2. The source electrode 18 is connected to the source pad 26 through a source wire 26a drawn from the active region 1 to the inactive region 2. The drain electrode 19 is electrically connected to the drain pad 27 through the source wire 26a drawn from the active region 1 to the inactive region 2.

The gate pad 25, the source pad 26, the drain pad 27, the gate wire 25a, the source wire 26a, and the drain wire 27a are formed on an interlayer insulating film (not shown).

On the other hand, the JG electrode 21 is formed so as to surround the drain electrode 19 so as to be located only in the active region 1. The JG electrode 21 is made to have the same potential as the potential of the source electrode 18 by being connected to the source electrode 18 in the active region 1.

Next, the operation of the semiconductor device including the switching device according to the present embodiment will be described.

In the switching device having both the MOS gate electrode 17 and the JG electrode 21 as described above, a general MOSFET operation is performed by the MOS gate electrode 17, and a JFET operation is performed by the JG electrode 21. For that reason, an equivalent circuit of the switching device according to the present embodiment has a circuit configuration shown in FIG. 4.

Figure 4:
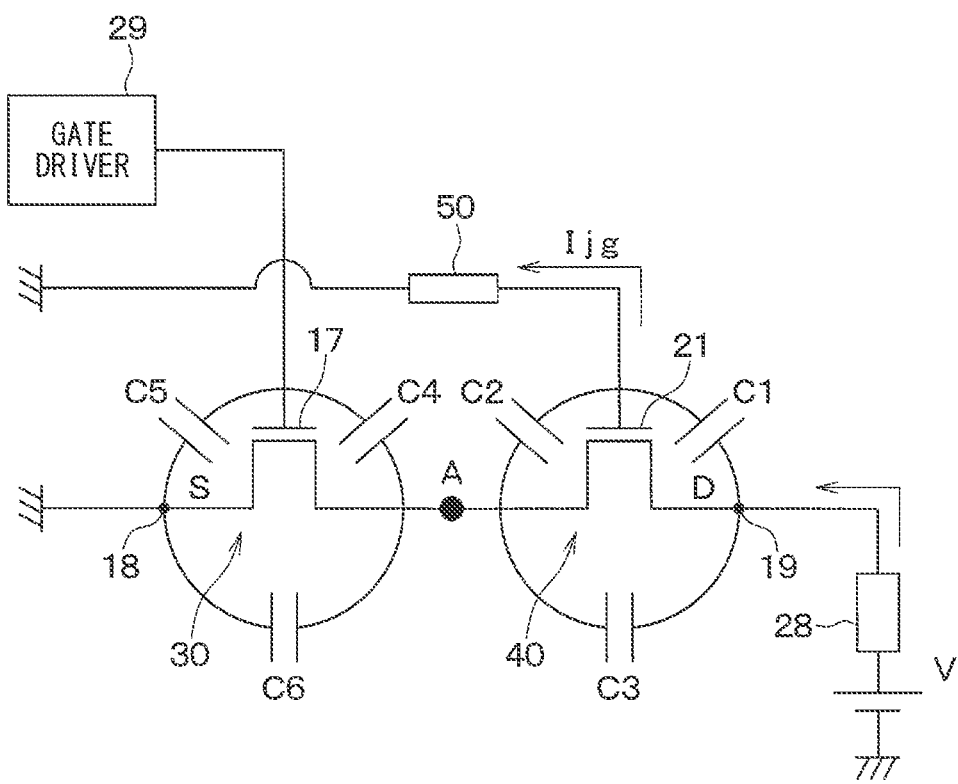
FIG. 4 is an equivalent circuit of a switching device shown in FIG. 2.

As shown in FIG. 4, the switching device is connected to a load 28, and the gate driver 29 controls the gate voltage to turn on and off the switching device, thereby driving the load 28.

In this example, the switching device has a configuration in which the normally-off MOSFET portion 30 formed by the MOS gate electrode 17 and the normally-on JFET portion 40 formed by the JG electrode 21 are connected in series with each other. As shown in FIG. 2, an intermediate potential point A between the MOSFET portion 30 and the JFET portion 40 indicates a portion of the front surface portion of the u-GaN layer 12 which is positioned below the JG electrodes 21 and becomes an intermediate potential.

The JG electrode 21 is connected to the source electrode 18 and has the same potential. A parasitic impedance 50 caused by wiring is present between the JG electrode 21 and the source electrode 18, but a value of the parasitic impedance 50 is low because the JG electrode 21 is connected directly to the source electrode 18 through the electrode layer 23. In the switching device configured as described above, in the JFET portion 40, the capacitors C1 to C3 are formed between the JG electrode 21 and the drain electrode 19 or the intermediate potential point A, and between the drain electrode 19 and the intermediate potential point A. In the MOSFET portion 30, capacitors C4 to C6 are formed between the MOS gate electrode 17 and the intermediate potential point A or the source electrode 18, and between the intermediate potential point A and the source electrode 18.

The operation of the switching device having the circuit configuration described above at the time of turning off will be described as follows.

Figure 5:
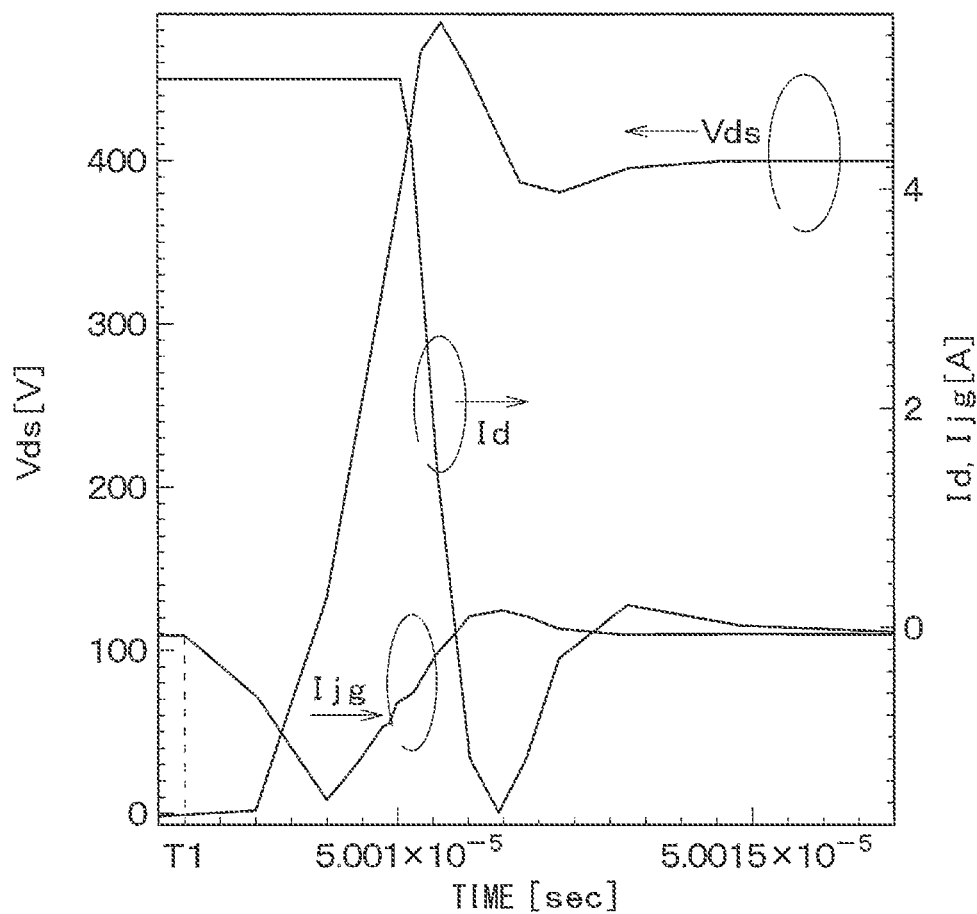
FIG. 5 is a diagram showing changes in current value and voltage value of each part at a time of turning off.

FIG. 5 shows waveforms at the time turning off the switching device in an H-bridge circuit with an inductive load. First, when a gate voltage applied to the MOS gate electrode 17 is stopped at a time T1 of FIG. 5, a potential of the intermediate potential point A rises since an off process of the MOSFET portion 30 starts. As the potential of the intermediate potential point A rises, the JFET gate-off process starts. In other words, a displacement current Ijg flows in a path from the drain electrode 19 through the JG electrode 21 to the GND, whereby the feedback capacitor C1 of the JFET is charged.

Then, a potential Vds of the drain electrode 19 is increased by the charge of the feedback capacitor C1. Further, a drain current Id decreases. When the potential of the intermediate potential point A exceeds the threshold voltage of the JFET portion 40, the JFET portion 40 is turned off. Accordingly, the entire switching device is turned off.

In order to speed up the turn-off operation, there is a need to charge the feedback capacitor C1 at a high speed. In order to charge the feedback capacitor C1 at a high speed, it is important to reduce the impedance between the JG electrode 21 and the source electrode 18 and to reduce the feedback capacitor C1.

On the other hand, in the present embodiment, since the JG electrode 21 and the source electrode 18 are directly connected to each other through the electrode layer 23, the resistance value of the parasitic impedance 50 due to the wiring resistance existing therebetween can be suppressed to be low. This makes it possible to reduce the impedance between the JG electrode 21 and the source electrode 18.

Figure 6:
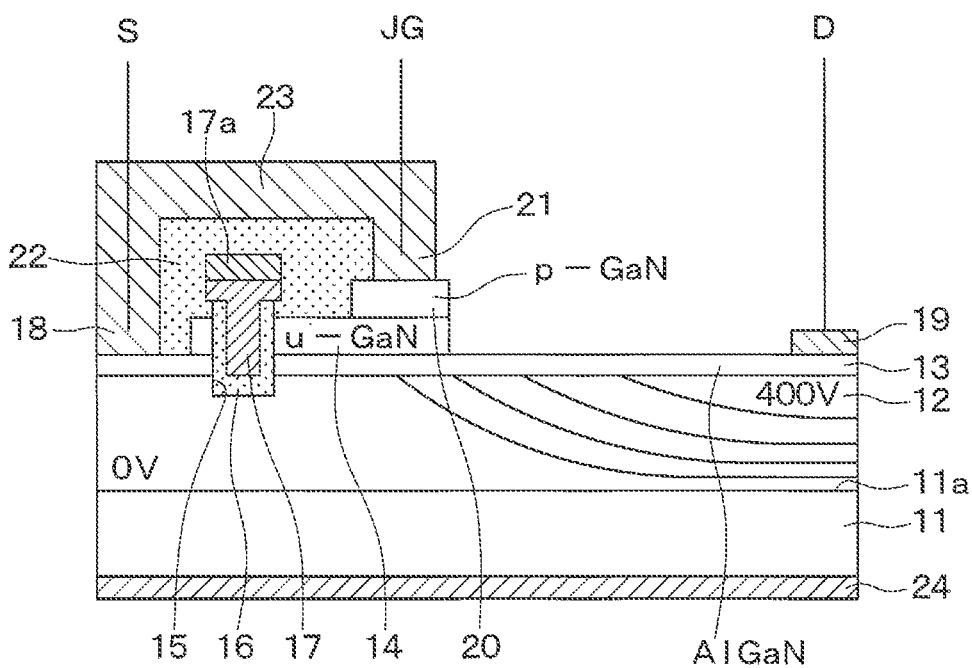
FIG. 6 is a simulation result showing equipotential lines after being turned off.

At the time of turn-off, the potential Vds of the drain electrode 19 increases, but the JG electrode 21 having the same potential as the potential of the source electrode 18 is disposed so as to surround the drain electrode 19. For that reason, as shown in FIG. 6, a high electric field caused by the drain electrode 19 can be blocked by the JG electrode 21, and an intrusion of the high electric field toward the source electrode 18 can be restricted. Therefore, the occurrence of a leakage current in the region under the source electrode 18 can be restricted.

As described above, in the present embodiment, the JG electrode 21 is disposed only in the active region 1. In other words, the JG electrode 21 is not disposed on a region where electrons can be trapped. For that reason, a threshold of the JG electrode 21 can be restricted from varying, and the characteristics of the semiconductor device can be restricted from changing.

In the present embodiment, the JG electrode 21 is formed so as to surround the drain electrode 19 when viewed from the normal direction to the one surface 11*a* of the substrate 11. For that reason, the high electric field caused by the drain electrode 19 can be restricted from intruding toward the source electrode 18. Therefore, the occurrence of a leakage current in the region under the source electrode 18 can be restricted.

In the present embodiment, the JG electrode 21 and the source electrode 18 are directly connected to each other through the electrode layer 23. For that reason, a resistance value of the parasitic impedance 50 can be lowered, and an impedance between the JG electrode 21 and the source electrode 18 can be reduced. In addition, the u-GaN layer 14 and the p-GaN layer 20 are disposed apart from the drain electrode 19, so that the facing area between the p-GaN layer 20 and the 2-DEG carriers is reduced as much as possible. For that reason, the feedback capacitor C1 can be reduced.

With a reduction in the wiring resistance between the JG electrode 21 and the source electrode 18, a reduction in the inductance, and a reduction in the feedback capacitor C1, the feedback capacitance C1 can be charged at high speed, and the JFET portion 40 can be turned off at a high speed. This makes it possible to further speed up the turn-off of the switching device. Therefore, a switching device capable of higher-speed switching can be provided.

In addition, the MOS gate electrode 17 is formed so as to penetrate through the u-GaN layer 14. Therefore, since an electric field intensity in the u-GaN layers 14 decreases toward the MOS gate electrodes 17 and an electric field strength of the gate insulating film 16 decreases, a reliability can be improved.

Second Embodiment

A second embodiment will be described. Since the present embodiment is the same as the first embodiment except for a change in a placement position of the JG electrodes 21 in the first embodiment, only portions different from the first embodiment will be described.

Figure 7:
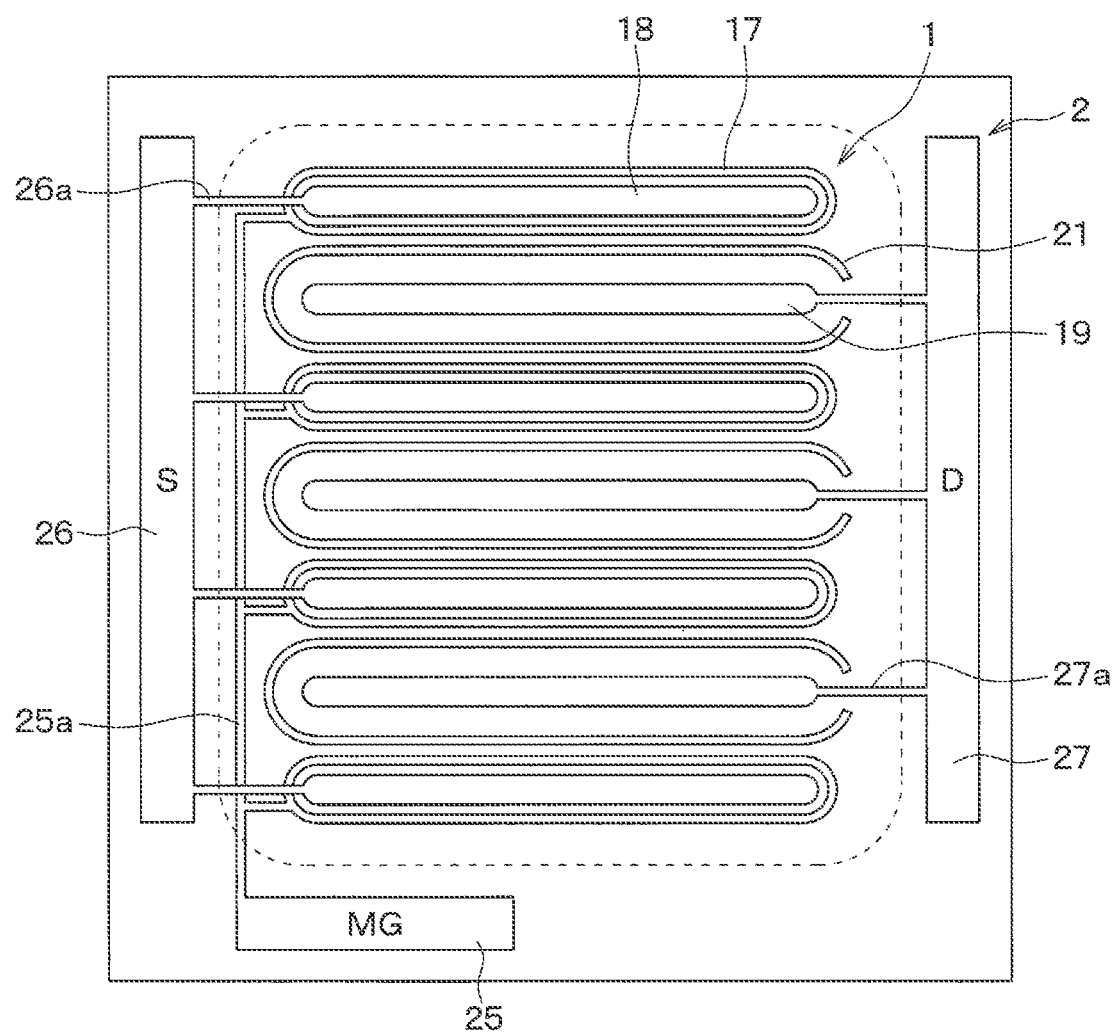
FIG. 7 is a schematic plan view of a semiconductor device according to a second embodiment.

In the present embodiment, as shown in FIG. 7, a JG electrode 21 is disposed so as not to intersect with a drain wire 27*a* when viewed from a normal direction to one surface 11*a* of a substrate 11. In other words, the JG electrode 21 is disposed at a position different from a position of the drain wire 27a and surrounds a drain electrode 19. In other words, the JG electrode 21 is substantially C-shaped.

As described above, in the present embodiment, the JG electrode 21 is disposed so as not to intersect with the drain wire 27a when viewed from the normal direction to the one surface 11a of the substrate 11. For that reason, a generation of a parasitic capacitance between the JG electrode 21 and the drain wire 27a can be restricted and the characteristics of a JFET portion 40 can be restricted from varying.

Third Embodiment

A third embodiment will be described. Since the present embodiment is the same as the second embodiment except for a change in a placement position of the JG electrodes 21 in the second embodiment, only portions different from the second embodiment will be described.

Figure 8:
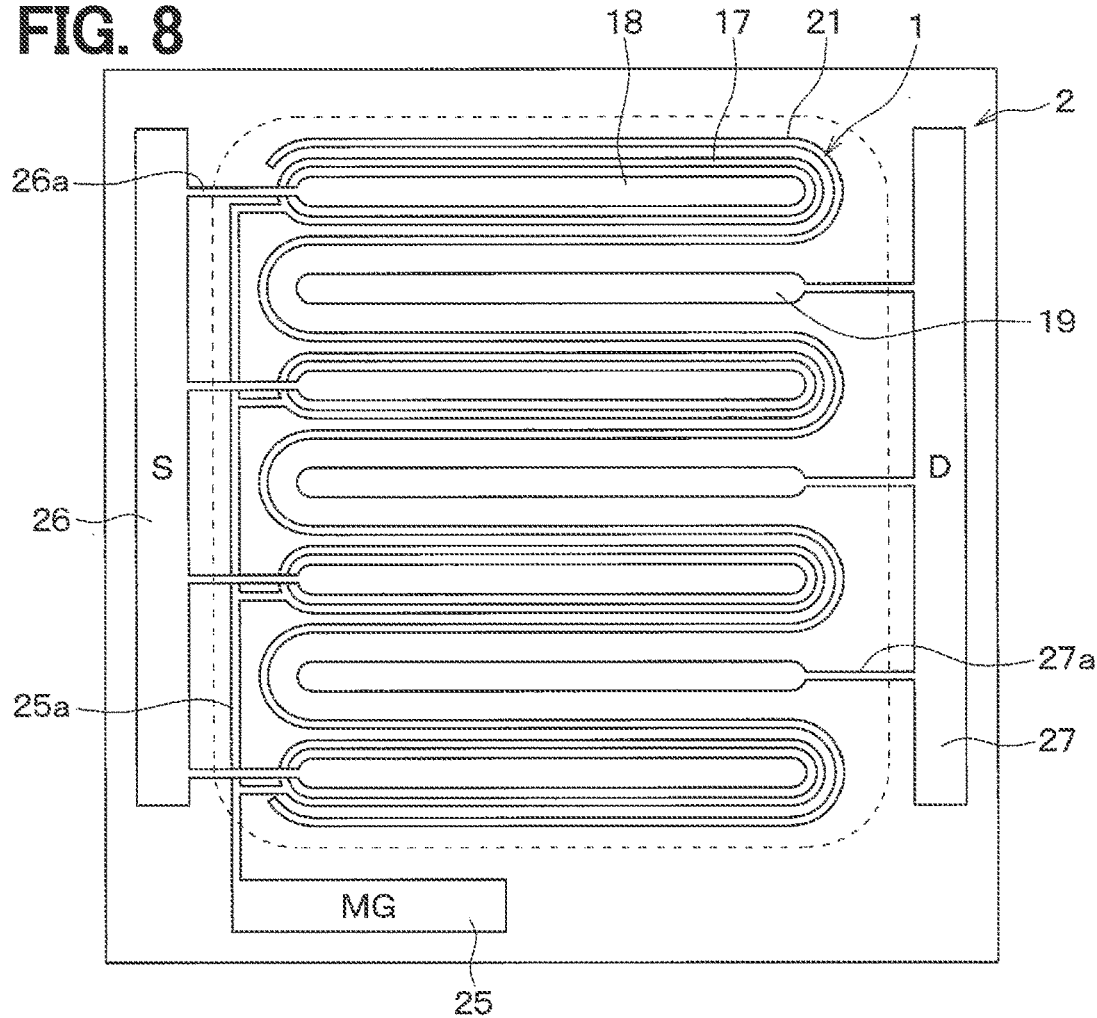
FIG. 8 is a schematic plan view of a semiconductor device according to a third embodiment.

In the present embodiment, as shown in FIG. 8, a JG electrode 21 is disposed so as not to intersect with a drain wire 27a when viewed from a normal direction to one surface 11a of a substrate 11. The JG electrode 21 is disposed so as to be positioned between all of a source electrode 18, a source pad 26, and a source wire 26a, and the drain electrode 19, a drain pad 27, and the drain wire 27a when viewed from a normal direction to the one surface 11a of the substrate 11. In other words, the JG electrode 21 is disposed so as to always intersect with a virtual line connecting the source electrode 18, the source pad 26, and the source wire 26a with the drain electrode 19, the drain pad 27, and the drain wire 27a when viewed from the normal direction to the one surface 11a of the substrate 11.

As described above, the JG electrode 21 is disposed so as to be positioned between all of the source electrode 18, the source pad 26, and the source wire 26a, and the drain electrode 19, the drain pad 27, and the drain wire 27a when viewed from the normal direction to the one surface 11a of the substrate 11. In other words, when the source electrode 18, the source pad 26, and the source wire 26a are collectively referred to as source portions, and the drain electrode 19, the drain pad 27, and the drain wire 27a are collectively referred to as drain portions, the JG electrode 21 is disposed between all the source portions and all the drain portions. For that reason, all the high electric fields caused by the drain electrode 19, the drain pad 27, and the drain wire 27a can be blocked by the JG electrode 21. In other words, the high electric field caused by the drain electrode 19, the drain pad 27, and the drain wire 27a can be restricted from intruding toward the source electrode 18, the source pad 26, and the source wire 26a. Therefore, a leakage current is restricted from occurring in the region under the source electrode 18, the source pad 26, and the source wire 26a.

OTHER EMBODIMENTS

Although the present disclosure has been described in accordance with embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

For example, in the above respective embodiments, the depth of the recessed portion 15 is set as the depth until the surface layer portion of the u-GaN layer 12 is partially removed, but this is also only an example. For example, the recessed portion 15 may have a depth until the surface of the u-GaN layer 12 is exposed, or may have a depth to the extent that a part of the u-AlGaN layer 13 remains at a bottom surface of the recessed portion 15 to the extent that no 2-DEG carrier is formed.

In the embodiments described above, the first and second GaN-based semiconductor layers configuring the channel forming layer are formed of the u-GaN layer 12 and the u-AlGaN layer 13. However, those configurations are examples, and other materials may be used as long as the channel forming layer is formed of the first GaN-based semiconductor layer and the second GaN-based semiconductor layer having a band gap energy larger than a band gap energy of the first GaN-based semiconductor layer.

Further, in the respective embodiments described above, the source electrode 18 and the JG electrode 21 are not integrated with each other, and may be electrically connected to each other by, for example, wire bonding or the like. Even in the configuration described above, since the JG electrode 21 is disposed only in the active region 1, a change in the characteristics of the semiconductor device can be restricted.

Figure 9:
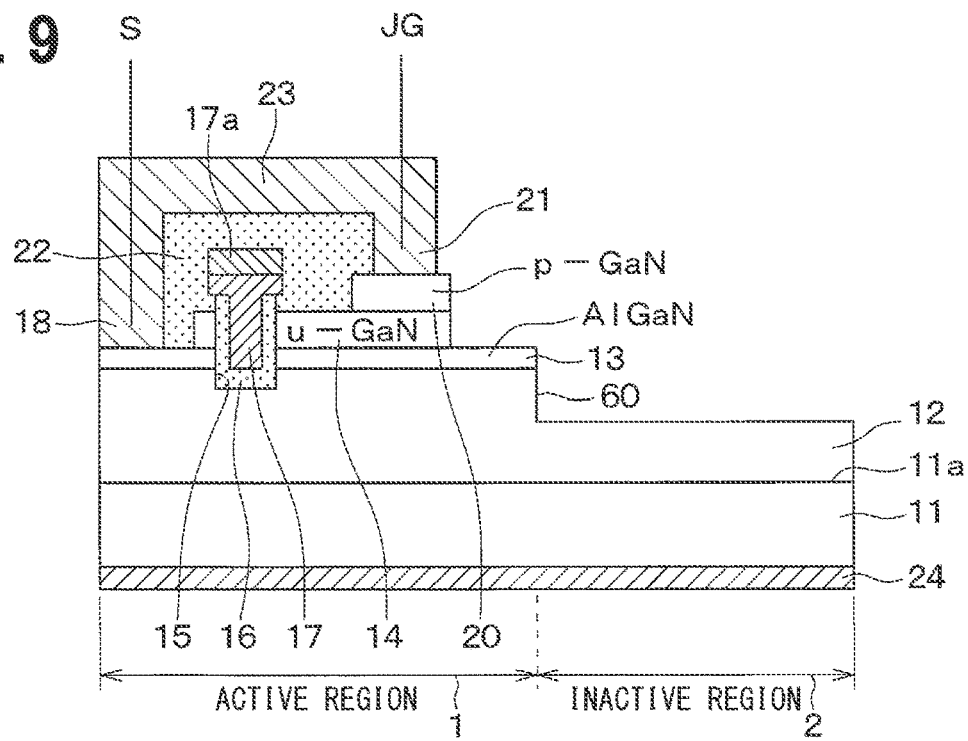
FIG. 9 is a cross-sectional view showing an inactive region of a semiconductor device according to another embodiment.

In the above respective embodiments, the configuration of the inactive region 2 can be appropriately changed. For example, as shown in FIG. 9, the inactive regions 2 may be formed by provision of a recessed portion 60 so as to remove upper portions of the u-AlGaN layer 13 and the u-GaN layer 12 so that 2-DEG carriers are not formed. In that instance, the recessed portion 60 may be formed to have a depth at which the 2-DEG carriers are not formed in the inactive regions 2, and may be formed to remove only the u-AlGaN layers 13, for example.

Figure 10:
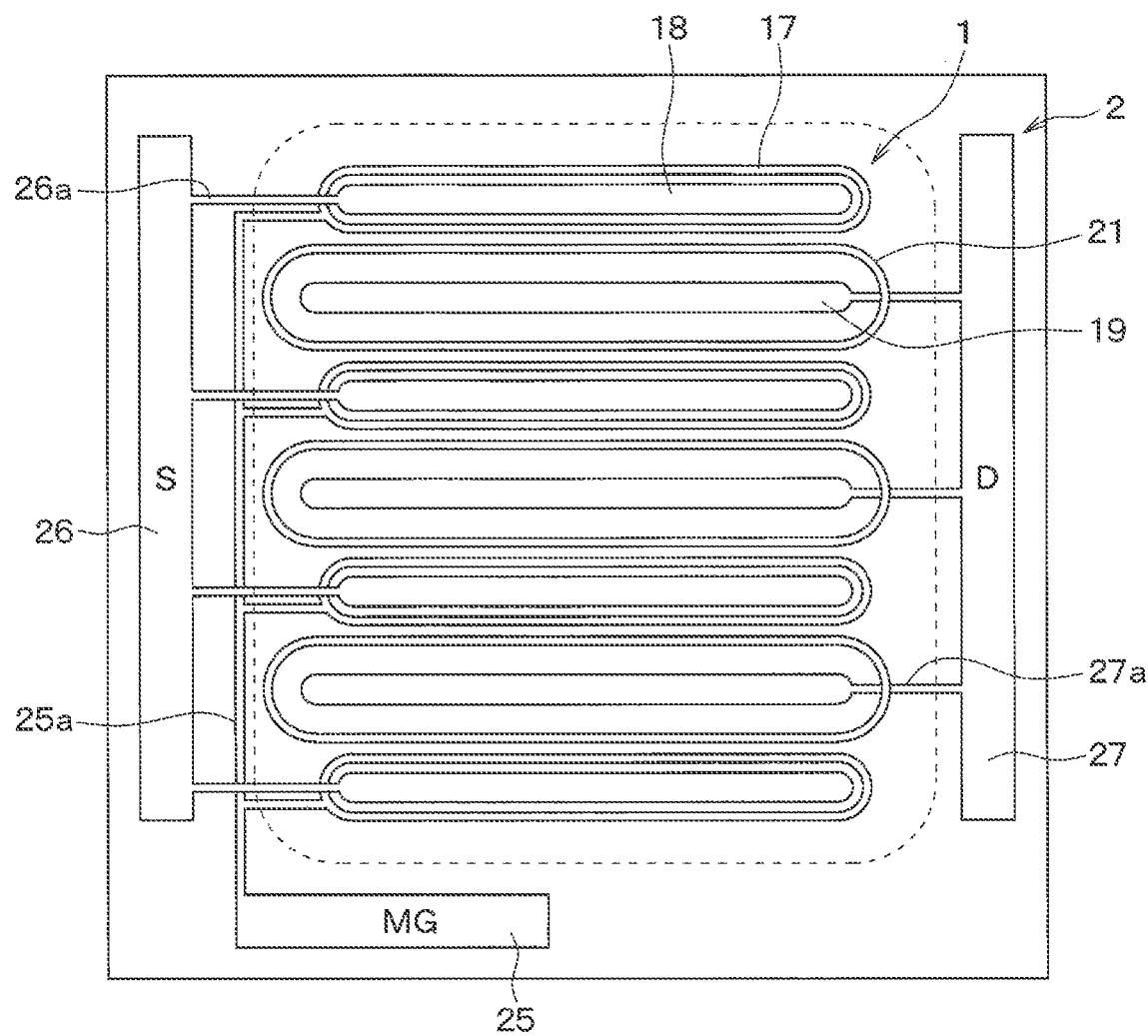
FIG. 10 is a schematic plan view of the semiconductor device according to another embodiment.

Further, in the first embodiment, as shown in FIG. 10, the gate wire 25a may be drawn to the inactive region 2 at the shortest distance from the portion connected to the MOS gate electrode 17, and may be drawn to the inactive region 2 and connected to the gate pad 25. In that case, the drain electrode 19 or the like may be extended to or in the vicinity of a portion where the gate wire 25a is formed in the first embodiment. In other words, the drain electrode 19 or the like may be extended to the vicinity of a boundary between the active region 1 and the inactive region 2. According to the above configuration, the active region 1 can be effectively used, and the area efficiency can be improved. In addition, although not particularly illustrated, in the second and third embodiments, the gate wire 25a may be drawn to the inactive region 2 at the shortest distance from the portion connected to the MOS gate electrode 17, and may be drawn to the inactive region 2 and connected to the gate pad 25.

What is claimed is:

1. A semiconductor device having an active region and an inactive region that surrounds the active region, and comprising:
    a lateral switching device disposed in the active region and including
        a channel forming layer that is disposed on a substrate, includes a heterojunction structure having a first semiconductor layer made of a first GaN-based semiconductor forming a drift region and a second semiconductor layer made of a second GaN-based semiconductor having a band gap energy higher than a band gap energy of the first GaN-based semiconductor, and has a recessed portion provided in the second semiconductor layer,
        a gate structure portion that includes a gate insulating film disposed in the recessed portion and a MOS gate electrode disposed on the gate insulating film and serving as a gate electrode of a MOS structure, a source electrode and a drain electrode which are disposed on the second semiconductor layer in such a manner that the gate structure portion is interposed between the source electrode and the drain electrode, a third semiconductor layer that is disposed on the second semiconductor layer at a position away from the drain electrode between the gate structure portion and the drain electrode, and is made of a third GaN-based semiconductor not doped with an impurity, a fourth semiconductor layer that is disposed on the third semiconductor layer and is made of a fourth GaN-based semiconductor having a p-type, and a junction gate electrode that is brought into contact with the fourth semiconductor layer;

a gate pad disposed in the inactive region and connected to the MOS gate electrode through a gate wire;

a source pad disposed in the inactive region and connected to the source electrode through a source wire; and a drain pad disposed in the inactive region and connected to the drain electrode through a drain wire, wherein the junction gate electrode is electrically connected to the source electrode to have a same potential as a potential of the source electrode, and is disposed only in the active region.

2. The semiconductor device according to claim 1, wherein
the junction gate electrode has an annular shape surrounding the drain electrode.

3. The semiconductor device according to claim 1, wherein
the drain electrode is connected to the drain pad disposed in the inactive region through the drain wire extending from the active region to the inactive region, and
the junction gate electrode is disposed at a position different from a position of the drain wire and surrounding the drain electrode.

4. The semiconductor device according to claim 1, wherein
the source electrode is connected to the source pad disposed in the inactive region through the source wire extending from the active region to the inactive region,
the drain electrode is connected to the drain pad disposed in the inactive region through the drain wire extending from the active region to the inactive region, and
when the source electrode, the source pad, and the source wire are collectively referred to as source portions, and the drain electrode, the drain pad, and the drain wire are collectively referred to as drain portions, the junction gate electrode is disposed between all the source portions and all the drain portions.

5. The semiconductor device according to claim 1, further comprising:
an interlayer insulating film covering the MOS gate electrode; and
an electrode layer disposed on the interlayer insulating film, wherein
the junction gate electrode is integrally connected with the source electrode through the electrode layer.

* * * * *